United States Patent [19]

Hatano et al.

[11] Patent Number: 5,079,184

[45] Date of Patent: Jan. 7, 1992

[54] METHOD OF MANUFACTURING III-IV GROUP COMPOUND SEMICONDUCTOR DEVICE

[75] Inventors: Ako Hatano; Toshihide Izumiya, both of Tokyo; Yasuo Ohba, Yokohama, all of Japan

[73] Assignee: Kabushiki Kaisha Toshiba, Kawasaki, Japan

[21] Appl. No.: 538,937

[22] Filed: Jun. 15, 1990

[30] Foreign Application Priority Data

| Jun. 16, 1989 | [JP] | Japan | 1-153872 |
| Jun. 30, 1989 | [JP] | Japan | 1-169646 |
| Jun. 30, 1989 | [JP] | Japan | 1-169647 |
| Mar. 30, 1990 | [JP] | Japan | 2-81363 |

[51] Int. Cl.$^5$ .................................................. H01L 21/20
[52] U.S. Cl. ............................. 437/107; 156/613; 437/94; 437/959; 437/971
[58] Field of Search ............... 148/DIG. 18, 23, 40, 148/56, 65, 110, 119, 155, 169; 156/610–614; 427/248.1, 255, 252.1; 437/81, 94, 105, 107, 949, 951, 959, 971; 556/170, 183

[56] References Cited

U.S. PATENT DOCUMENTS

| 3,492,175 | 1/1970 | Conrad | 437/81 |
| 4,193,835 | 3/1980 | Inoue et al. | 437/94 |
| 4,214,926 | 7/1980 | Katsuto | 156/613 |
| 4,716,130 | 12/1987 | Johnston, Jr. et al. | 437/94 |
| 4,734,514 | 3/1988 | Melas | 556/70 |
| 4,782,034 | 11/1988 | Dentai et al. | 437/94 |
| 4,904,616 | 2/1990 | Bohling et al. | 437/81 |
| 4,916,088 | 4/1990 | Mooney et al. | 437/81 |
| 4,965,222 | 10/1990 | Staring | 437/81 |
| 5,015,747 | 5/1991 | Hostalek et al. | 437/81 |

FOREIGN PATENT DOCUMENTS

| 0141561 | 5/1985 | European Pat. Off. | 437/94 |
| 8403995 | 10/1984 | PCT Int'l Appl. | 437/81 |

OTHER PUBLICATIONS

Tanamura et al., "Magnesium Doping of (Aluminum, Galhium) Arsenide...", J. Appl. Physics, 59(10), 1986, pp. 3549-3554.

Journal of Crystal Growth, vol. 93, 1988, pp. 613-617, North-Holland, Amsterdam, NL; Y. Ohba et al.: "A Study of P-Type Doping For AlGaInP Grown by Low-Pressure MOCVD".

Journal of Applied Physics, vol. 64, No. 10, 15th Nov. 1988, pp. 4975-4986, Woodbury, NY, U.S.; P. J. Wang et al.: "Deep Levels in P-Type GaAs Grown by Metal-Organic Vapor Phase Epitaxy".

*Primary Examiner*—Olik Chaudhuri
*Assistant Examiner*—William Bunch
*Attorney, Agent, or Firm*—Oblon, Spivak, McClelland, Maier & Neustadt

[57] ABSTRACT

A magnesium-doped p-type III-V Group compound semiconductor layer can be formed by metal organic chemical vapor deposition, by reacting, in a vapor phase, at least one compound of a Group III element with at least one compound of a Group V element, in the presence of an adduct of an organic magnesium compound with another compound as a doping source of magnesium.

24 Claims, 10 Drawing Sheets

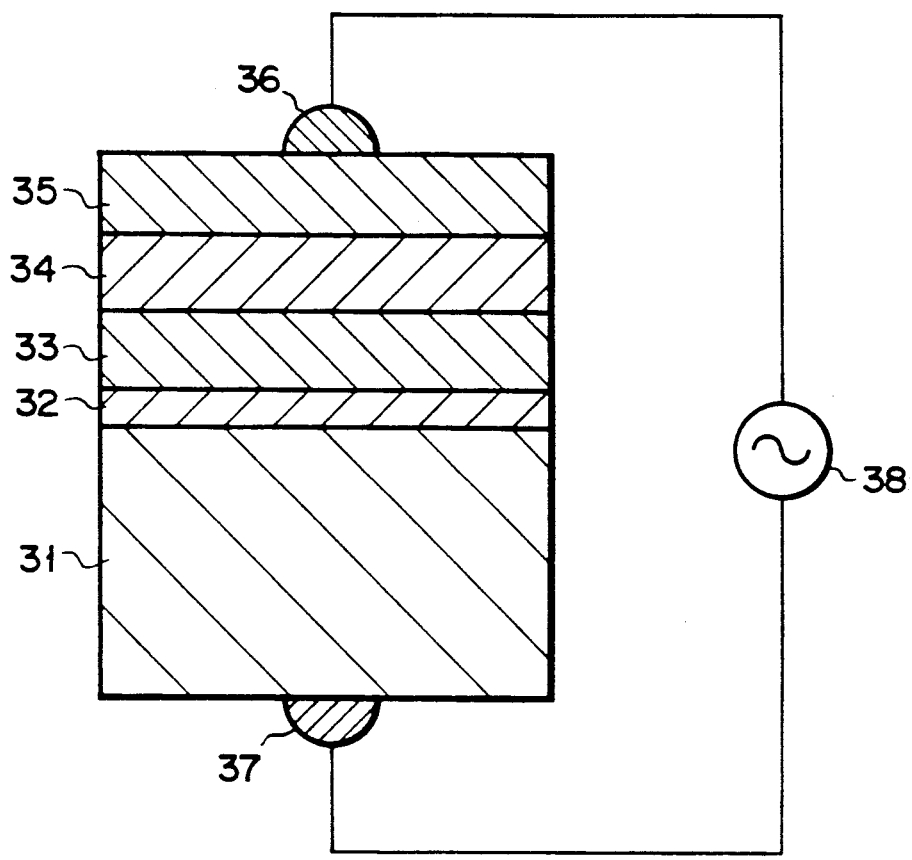
F I G. 2

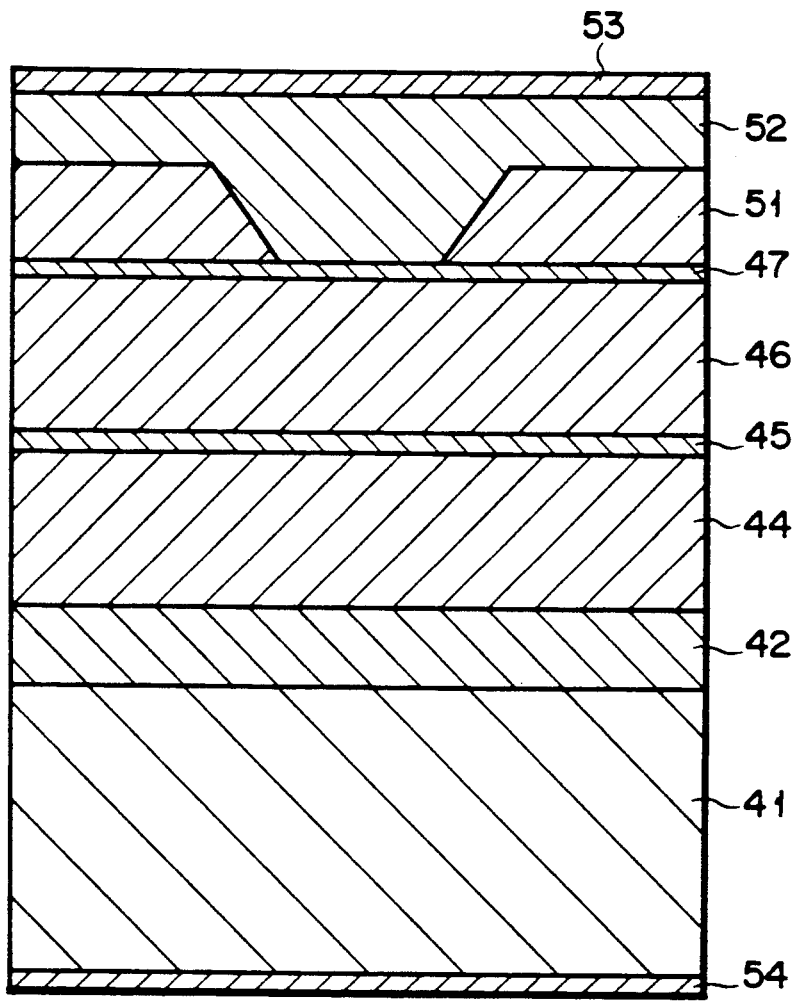
F I G. 5

METHOD OF MANUFACTURING III-IV GROUP COMPOUND SEMICONDUCTOR DEVICE

BACKGROUND OF THE INVENTION

1. Field of the Invention

The present invention relates to a method of manufacturing a III-V Group compound semiconductor device and, more particularly, to a method of manufacturing a III-V Group compound semiconductor device, including the step of forming a magnesium-doped p-type III-V Group compound semiconductor layer by metal organic chemical vapor deposition.

2. Description of the Related Art

Metal organic chemical vapor deposition (MOCVD) is a well-known technique of forming a compound semiconductor layer in the art. In the formation of a p-type III-V Group compound semiconductor by the MOCVD technique, zinc is usually used as a p-type dopant. Zinc exhibits substantially good doping characteristics as a dopant for GaAs. However, when zinc is used as a dopant for a III-V Group compound semiconductor containing phosphorus such as InP or GaInAlP, its doping rate becomes low, and its activation rate is also low. In addition, since a diffusion speed of zinc is too high, it has a poor doping controllability.

As a p-type dopant which can replace zinc, therefore, the use of beryllium or magnesium has been attempted. Beryllium exhibits good characteristics as a p-type dopant in a molecular beam epitaxial growth method. However, since an organic compound of beryllium has a strong toxicity, an application of beryllium to the MOCVD method must be avoided.

An organic compound of magnesium has little problem of toxicity unlike an organic beryllium compound. Examples of such an organic magnesium compound are alkylmagnesium compounds such as dimethylmagnesium and diethylmagnesium. These alkylmagnesium compounds have a very strong self-adsorptive property and have no effective vapor pressure required in the MOCVD method. Although biscyclopentadienylmagnesium ($Cp_2Mg$) having a cyclopentadiene with a comparatively high vapor pressure is used, it is very difficult to control doping due to a memory effect (that a doping source adhered on a reaction tube re-enters a reaction system during subsequent processing) remaining in an apparatus. Therefore, a sharp concentration change of $10^3/cm^3$ or more in a 0.1 μm distance, which is normally required for a device, cannot be obtained. In addition, bismethylcyclopentadienylmagnesium (($CH_3)_2Cp_2Mg$) having methyl group introduced on each cyclopentadiene to increase a vapor pressure has been used. However, a sufficiently sharp or steep concentration change is not obtained.

As described above, an alkyl compound of magnesium has only a low vapor pressure, and a magnesium compound having a cyclopentadiene has a strong memory effect to make it difficult to perform doping with good controllability.

SUMMARY OF THE INVENTION

It is, therefore, an object of the present invention to provide a method of manufacturing a III-V Group compound semiconductor device by a metal organic chemical vapor deposition, which can perform doping of a p-type impurity with high controllability by using an organic magnesium compound having an effective vapor pressure and no memory effect, as a magnesium doping source.

A method of manufacturing a III-V Group compound semiconductor device including magnesium-doped p-type compound semiconductor layer according to the present invention comprises use of an adduct of a magnesium-containing organic metal compound (organic magnesium compound) with another compound, as a doping source of magnesium, in the formation of the magnesium-doped p-type compound semiconductor layer by metal organic chemical vapor deposition.

BRIEF DESCRIPTION OF THE DRAWINGS

FIG. 2 is a sectional view showing a semiconductor diode manufactured according to an embodiment of the present invention;

FIG. 5 is a sectional view showing a semiconductor device manufactured according to still another embodiment of the present invention, which is a modification of the device shown in FIG. 3;

DETAILED DESCRIPTION OF THE PREFERRED EMBODIMENTS

Figure 1:
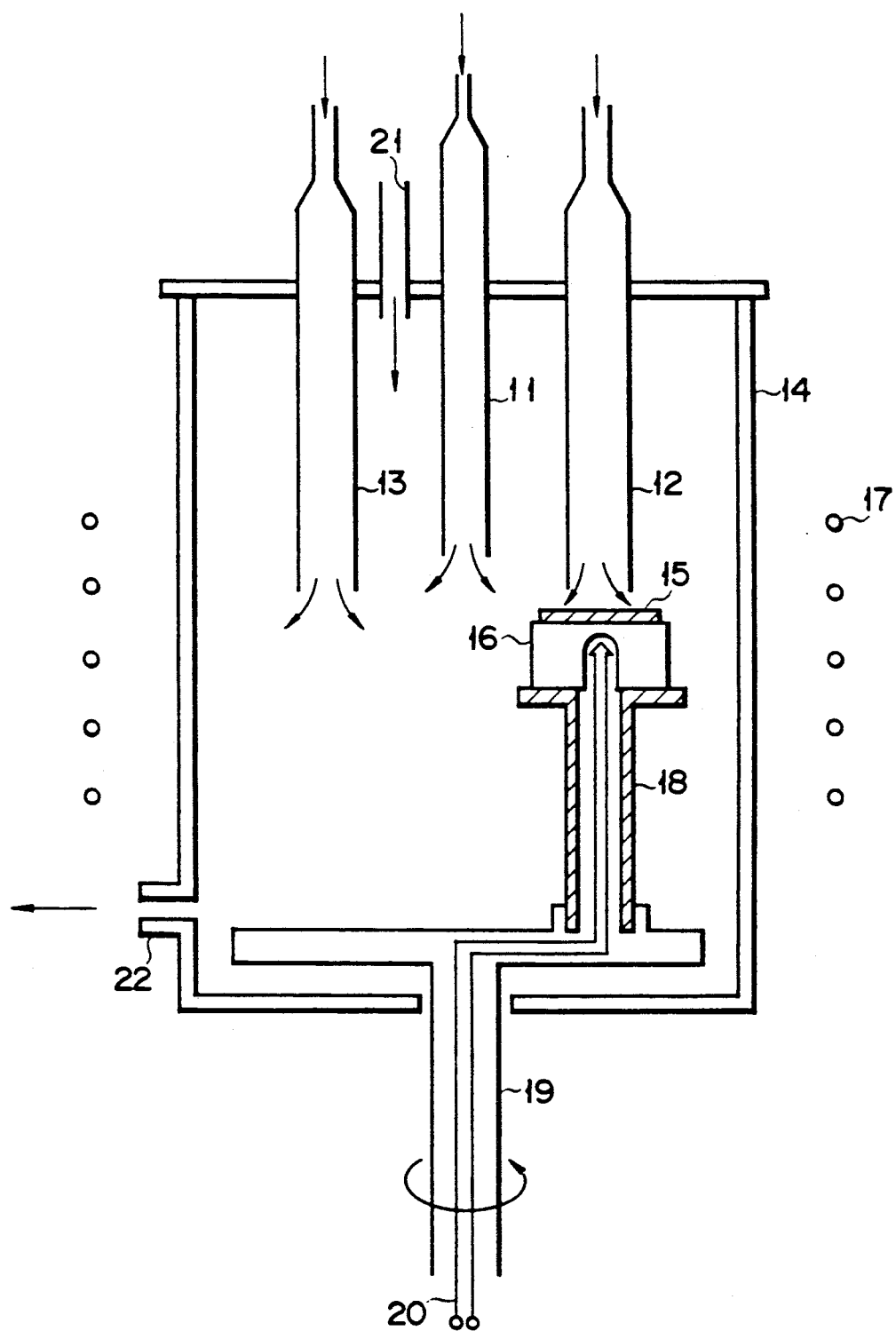
FIG. 1 is a sectional view showing a metal organic chemical vapor deposition apparatus suitably used to practice the present invention.

The present inventors made studies on various types of organic magnesium compounds and found that a memory effect of $Cp_2Mg$ as described above was not a common problem to organic magnesium compounds but a specific problem encountered in only certain magnesium compounds having a cyclopentadiene. That is, the memory effect can be eliminated by using an organic magnesium compound not having a cyclopentadiene, as a doping source. In addition, the present inventors found that even an organic magnesium compound which, by itself, does not have a sufficiently effective vapor pressure can have a sufficient vapor pressure when it is adducted with another organic compound. For example, as described above, since dimethylmagnesium has a very strong self-association property and is a solid even at a high temperature, and has a low vapor pressure, it is not suitable as a doping source of magnesium. However, it has been fount that when dimethylmagnesium forms an adduct with another compound, the self-adsorptive property is remarkably suppressed, and the vapor pressure is increased. For example, Mg(Al(CH$_3$)$_4$)$_2$ (octamethyldialuminummonomagnesium) and CH$_3$Mg(Al(CH$_3$)$_4$) (pentamethylaluminummagnesium) each of which is an adduct with Al(CH$_3$)$_3$, an organic aluminum compound, have melting points of 39° C. and 54° C., respectively. Therefore, these adducts can provide sufficient vapor pressures. Note that when an adduct containing aluminum such as Mg(Al(CH$_3$)$_4$)$_2$ or CH$_3$Mg(Al(CH$_3$)$_4$) is used, aluminum which is a constitutional element of the adduct is doped simultaneously with magnesium in a semiconductor layer. However, since an amount of a doping source is much smaller than that of an aluminum compound to be used to grow a III-V Group semiconductor containing aluminum, substantially no problem is posed.

Thus, according to the present invention, p-type doping with good sharpness and high reproducibility can be performed by using an adduct of an organic magnesium compound with another compound, which has a sufficiently high vapor pressure and no memory effect, is used as a Mg doping source in the formation of a magnesium-doped p-type III-V Group semiconductor layer.

Magnesium-containing adduct (doping source of Mg) used in the present invention should not be limited to the above described Mg(Al(CH$_3$)$_4$)$_2$ and CH$_3$Mg(Al(CH$_3$)$_4$). Generally, an adduct of an organic magnesium compound with an organic compound containing a Group III element, Group V element or metal, other than aluminum, can be used in the present invention. For example, an adduct, octaalkyl-dialuminum or -dinitrogen magnesium, represented by the formula:

$$Mg(E(R)_4)_2 \qquad (I),$$

or an adduct, pentaalkyl-aluminum or -nitrogen magnesium, represented by the formula:

$$RMg(E(R)_4) \qquad (II)$$

can be effectively used. In these formulas, each of R is independently an alkyl group, preferably having 1 to 4 carbon atoms, and E is aluminum or nitrogen atom. Examples of the adduct of formula (I) include Mg(Al(C$_2$H$_5$)$_4$)$_2$, and Mg(N(CH$_3$)$_2$, in addition to the above described Mg(Al(CH$_3$)$_4$)$_2$. Examples of the adduct of formula (II) include CH$_3$(Mg(Al(CH$_3$)$_4$), C$_2$H$_5$Mg(Al(C$_2$H$_5$)$_4$), and CH$_3$Mg(N(CH$_3$)$_4$), in addition to the above described CH$_3$Mg(Al(CH$_3$)$_4$). Further, an adduct of an organic magnesium compound with ethylenediamine can also be used.

In order to form a magnesium-doped p-type III-V Group semiconductor layer in a III-V group semiconductor device, compounds containing elements constituting the III-V Group semiconductor (for example, organic compounds of Group III element, and compounds of Group V element), as well as a magnesium-containing adduct of the invention, are introduced in gaseous state in a MOCVD apparatus at a reduced pressure of about 25 to 300 Torr, and allowed to contact with a substrate which is placed in the apparatus beforehand and heated to about 500° to 1150° C. Then, the compounds of the Group III and V elements react with each other to produce a corresponding III-V Group semiconductor, which deposits on the substrate. At the same time, the magnesium-containing adduct decomposes, and the magnesium is incorporated in the depositing III-V Group semiconductor. Since the reaction between the compounds of Group III element and the Group V element proceeds substantially quantitatively, these two reactants can be used in amounts of Group III element and Group V element, respectively, which correspond to the composition of a desired III-V Group semiconductor to be produced. Further, the doping amount (concentration) of the magnesium in the produced semiconductor substantially corresponds to the concentration of the magnesium-containing adduct in terms of magnesium in the vapor phase mixture of the compounds of Group III and V elements used.

Many compounds can be used as MOCVD material. For example, compounds of Group III element include a gallium source such as trimethylgallium (TMG), and triethylgallium (TEG); an aluminum source such as trimethylaluminum (TMA), and triethylaluminum (TEA); a boron source such as trimethylboron (TMB), triethylboron (TEB), and diborane (B$_2$H$_6$); a indium source such as trimethylindium (TMI); and the like. Further, compounds of Group V element include a phosphorus source such as phosphine (PH$_3$); an arsenic source such as arsine (AsH$_3$); a nitrogen source such as ammonia (NH$_3$), and hydrazine (N$_2$H$_4$); and the like. As a nitrogen source, an organic metal compound which is a adduct containing nitrogen, such as Ga(C$_2$H$_5$)NH$_3$ or Ga(CH$_3$)$_3$N(CH$_3$)$_3$, can also be used.

The present invention can be applied to the manufacture of various types of devices, such as a semiconductor laser, an LED, an FET, and an HBT, constituted by various types of Group III-V compound semiconductor materials such as GaAs-based, InP-based, GaAl-based, InGaAsP-based, InGaAlP-based, InGaAlAs-based, InGaAs-based, and InAlAs-based semiconductor materials.

The present invention will be described in more detail with reference to the accompanying drawings. Throughout the Figures, the same reference numerals are used to indicate the same or similar portions.

FIG. 1 shows one example of an MOCVD apparatus which can be suitably used to manufacture a III-V Group compound semiconductor device according to the present invention. This apparatus has quartz reaction tubes 11, 12, and 13, and required source gases are supplied from gas inlet ports formed at upper portions of the respective tubes. These reaction tubes 11, 12, and 13 are vertically connected to a chamber 14 so as to extend through an upper cover of the chamber 14. A substrate 15 is placed on a graphite susceptor 16 so as to oppose the lower opening of the tubes 11, 12 or 13, and is heated to a high temperature by an external RF coil 17. The susceptor 16 is mounted on a quartz holder 18. The susceptor 16 can be moved circularly beneath the tubes 11, 12, and 13, which are arranged on the circumference of the circular motion, at a high speed of, e.g., 0.1 sec by a driving shaft 19 sealed by a magnetic fluid seal and extending through the bottom of the chamber 14. Driving is performed by a motor which is controlled by an externally installed computer A thermocouple 20 is located at the center of the susceptor 16 and monitors the temperature immediately below the substrate 15. A slip ring is used in a cord portion of the thermocouple 20 to prevent torsion caused by rotation. Reaction gases are forcibly flowed out by a fast down-flow of hydrogen gas supplied from an upper injection port 21 and exhausted from an exhaust port 22 by a rotary pump while mixing of the gases is minimized.

Using the MOCVD apparatus having the above arrangement, each of desired combinations of source gases for different compositions of III-V Group semiconductors is flowed through each of the reaction tubes 11, 12, and 13, and the substrate 15 is moved by the computer-controlled motor, thereby producing a multilayered structure on the substrate 15 at a desired layer stacking period with a desired composition. In this method, a sharp concentration change which cannot be obtained by a gas switching method can be easily realized. In addition, since reaction gases need not be switched at a high speed in order to form a sharp hetero interface, a problem of a low decomposition rate of $NH_3$ or $PH_3$ as a source gas can be solved by setting a gas flow rate at a low level.

The MOCVD apparatus shown in FIG. 1 was used to manufacture the following III-V Group compound semiconductor device. Trimethylgallium (TMG), trimethylaluminum (TMA), triethylboron (TEB), and trimethylindium (TMI) were used as an organic compound of a Group III element. Phosphine ($PH_3$), arsine ($AsH_3$), and ammonia ($NH_3$) were used as a hydride of a Group V element. Silane ($SiH_4$) was used as an n-type dopant, and $Mg(Al(CH_3)_4)_2$ was used as a p-type dopant.

FIG. 2 is a schematic sectional view showing a III-V Group compound semiconductor device manufactured by the above method at a substrate temperature of 750° C., a reaction chamber internal pressure of 25 Torr, a growth rate of 3 μm/hour, and a reaction chamber internal flow rate of 70 cm/sec. This device has a p-type GaAs substrate 31 (an impurity concentration of $1 \times 10^{19}$ cm$^{-3}$). On the substrate 31, a p-type GaAs buffer layer 32 (a thickness of 0.5 μm, and an impurity concentration of $1 \times 10^{18}$ cm$^{-3}$), a p-type $In_{0.5}(Ga_{1-x}Al_x)_{0.5}P$ layer 33 (a thickness of 1 μm, and an impurity concentration $1 \times 10^{18}$ cm$^{-3}$), and an n-type $In_{0.5}(Ga_{1-x}Al_x)_{0.5}P$ layer 34 (a thickness of 1 μm, and an impurity concentration of $1 \times 10^{18}$ cm$^{-3}$) are formed, and an n-type GaAs contact layer 35 (a thickness of 2 μm, and a concentration of $1 \times 10^{17}$ cm$^{-3}$ is formed on the layer 34. Ohmic electrodes 36 and 37 are formed on the two surfaces of the device, which are to be connected to a power source 38.

When the obtained wafer was cleaved, and a diode was fabricated as shown in FIG. 2, an ideality factor was close to 1, and good current-voltage (I-V) characteristics were obtained. Secondary ion mass spectrometry (SIMS) analysis was performed for Mg near the p-n junction interfaces. As a result, it was confirmed that the Mg concentration was constant in each p-type layer, the Mg was not diffused into the n-type layer, and a sharp concentration change of $10^3$ cm$^{-3}$ or more in 100 Å was obtained in the junction interface. Further, the carrier concentration was maintained at a constant value of $1 \times 10^{18}$ cm$^{-3}$ in the p-type layers.

Figure 3:
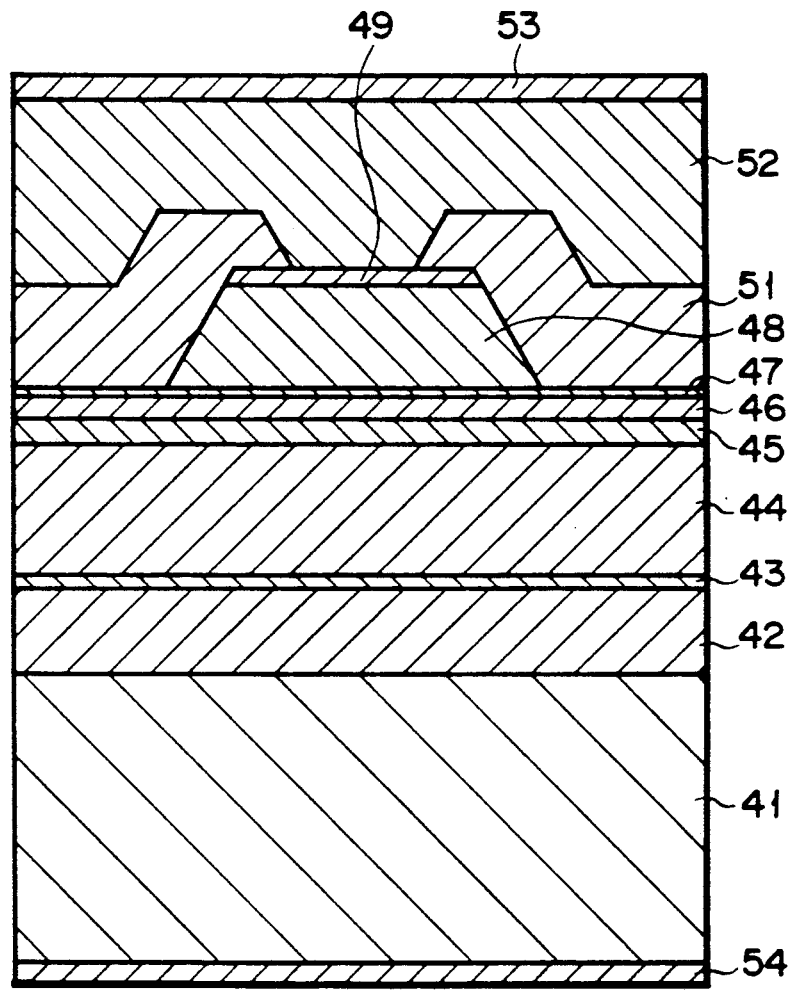
FIG. 3 is a sectional view showing a semiconductor laser manufactured according to another embodiment of the present invention.

FIG. 3 is a sectional view showing a schematic structure of a semiconductor laser device manufactured by the method of the present invention. This laser device has an Si-doped n-type GaAs substrate 41 (an impurity concentration of $3 \times 10^{18}$ cm$^{-3}$), and an Si-doped n-type GaAs buffer layer 42 (a thickness of 0.5 μm, and an impurity concentration of $3 \times 10^{18}$ cm$^{-3}$) and an Si-doped n-type InGaP buffer layer 43 (a thickness of 0.5 μm, and an impurity concentration of $3 \times 10^{18}$ cm$^{-3}$) are formed on the substrate 41. A double heterojunction structure constituted by an Si-doped n-type $In_{0.5}Ga_{0.2}Al_{0.3}P$ clad layer 44 (a thickness of 1.5 μm, and an impurity concentration of $1 \times 10^{18}$ cm$^{-3}$), an undoped $In_{0.5}Ga_{0.5}P$ active layer 45 (a thickness of 1 μm), and Mg-doped p-type InGaAlP-based clad layers 46, 47, and 48 is formed on the buffer layer 43. The Mg-doped clad layers 46, 47, and 48 are of $In_{0.5}Ga_{0.2}Al_{0.3}P$ (a thickness of 0.1 μm, and an impurity concentration of $2 \times 10^{18}$ cm$^{-3}$), $In_{0.5}Ga_{0.5}Al_{0.1}P$ (a thickness of 0.2 μm, and an impurity concentration of $1 \times 10^{18}$ cm$^{-3}$), and $In_{0.5}Ga_{0.2}Al_{0.3}P$ (a thickness of 1.4 μm, and an impurity concentration of $2 \times 10^{18}$ cm$^{-3}$), respectively. The clad layer 47 has a low Al content and serves as an etch stopping layer. The clad layer 48 is formed into stripes to form stripe-like ribs on the p-type clad layer. A Mg-doped p-type $In_{0.5}Ga_{0.4}Al_{0.1}P$ intermediate band gap layer 49 (a thickness of 0.01 μm, and an impurity concentration of $2 \times 10^{18}$ cm$^{-3}$) is formed on the clad layer 48. An Si-dope n-type GaAs current blocking layer 51 (a thickness of 0.5 μm, and an impurity concentration of $5 \times 10^{18}$ cm$^{-3}$) is formed on the side surfaces of the double heterojunction portion, and a Mg-doped p-type GaAs contact layer 52 (a thickness of 3 μm, and an impurity concentration of $5 \times 10^{18}$ cm$^{-3}$) is formed thereon. A metal electrode 53 of Au/Zn is formed on the upper surface of the contact layer 52, and a metal electrode 54 of Au/Zn is formed on the lower surface of the substrate 41. In this structure, current path is performed by the intermediate band gap layer 49 and the current blocking layer 51, and optical waveguiding is performed by the clad layer 48 formed into a stripe-like mesa.

The wafer obtained as described above was cleaved, and a laser device having a cavity length of 250 μm was fabricated. As a result, good characteristics of a threshold current of 40 mA and a differential quantum efficiency per surface of 20% were obtained. An optical output was linearly increased up to 10 mW or more in accordance with a drive current, exhibiting good current-optical output characteristics without any kink. In addition, both of far and near field patterns had only one peak, i.e., good mode control was performed. An operation voltage was as low as 2.1 V, and a very long life of 10,000 hours was obtained. In this manner, by performing good doping with high controllability, a semiconductor laser which simultaneously achieved a low threshold value, a high output, and a high reliability could be manufactured.

Figure 4:
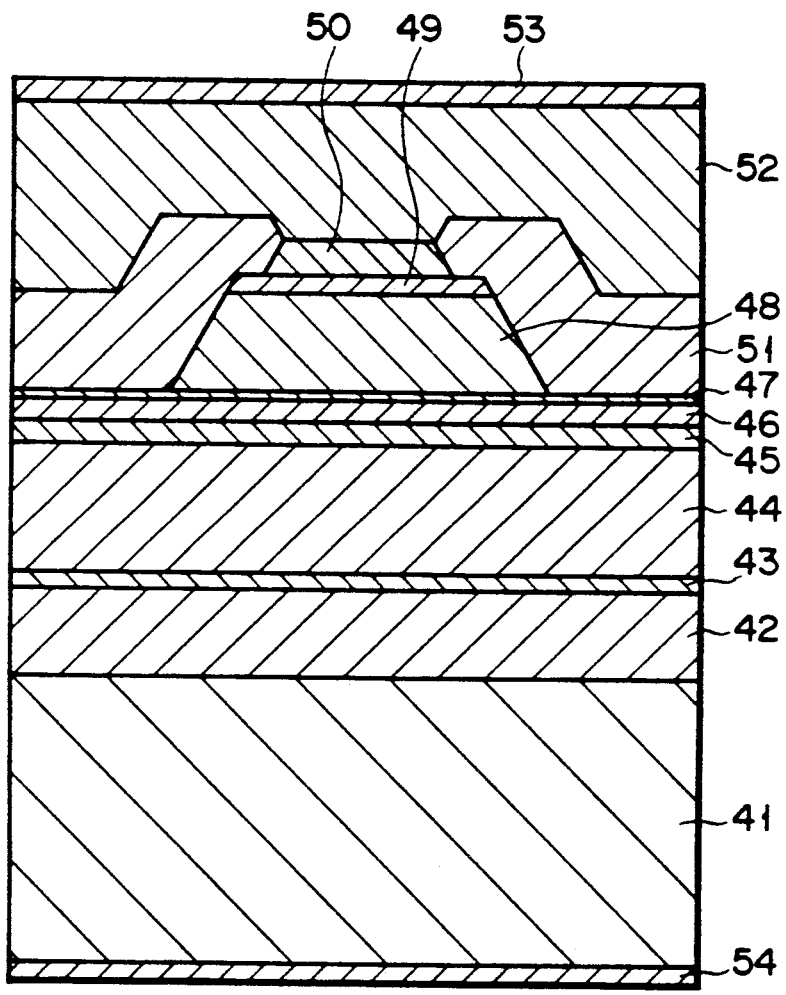
FIG. 4 is a sectional view showing a semiconductor laser manufactured according to still another embodiment of the present invention, which is a modification of the device shown in FIG. 3.

FIG. 4 is a sectional view showing a semiconductor laser device similarly obtained in accordance with the method of the present invention. This semiconductor device differs from the laser device shown in FIG. 3 in that current path is performed by a p-type GaAs contact layer 50.

Also, a laser device having a structure shown in FIG. 5 can be similarly manufactured by the method of the present invention.

Figure 6:
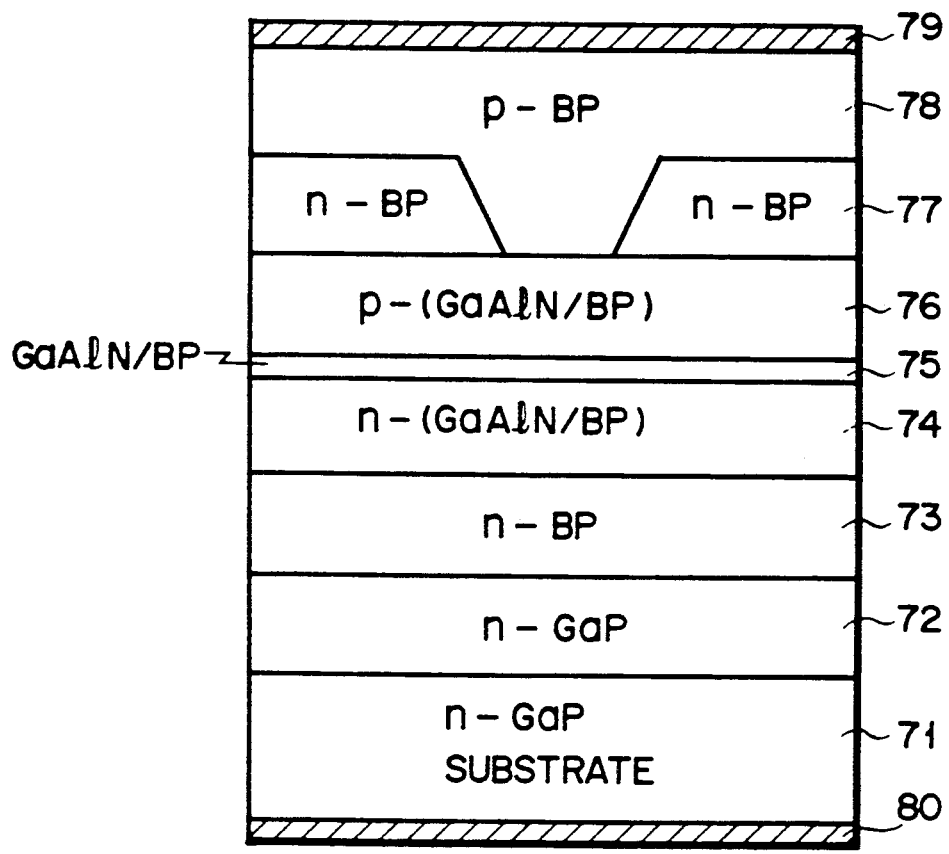
FIG. 6 is a sectional view showing a semiconductor laser manufactured according to still another embodiment of the present invention.
Figure 7:
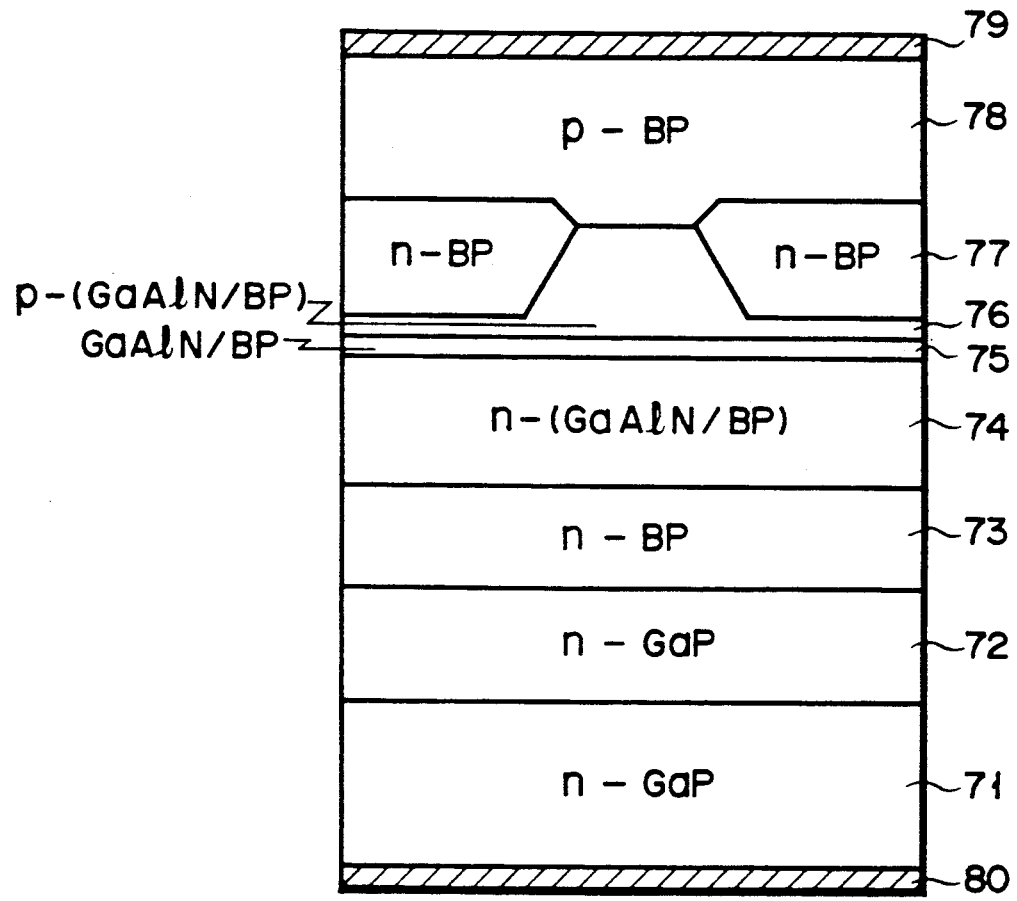
FIG. 7 is a sectional view showing a semiconductor laser manufactured according to still another embodiment of the present invention, which is a modification of the device shown in FIG. 6.
Figure 8:
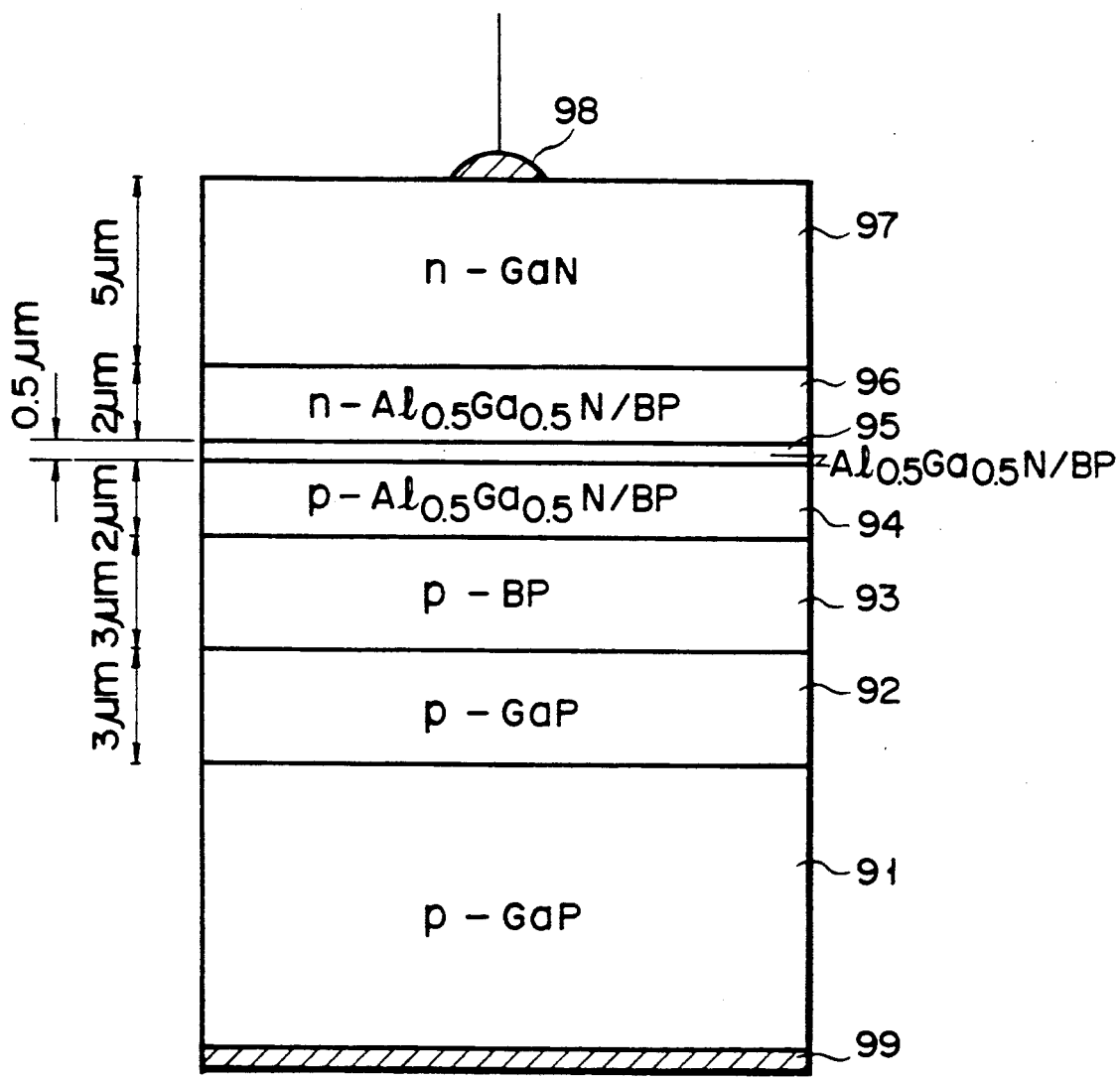
FIG. 8 is a sectional view showing an LED manufactured according to still another embodiment of the present invention.

FIGS. 6 to 8 are sectional views each showing a different III-V Group compound semiconductor device manufactured by the method of the present invention. These devices are formed using GaAlBNP-based materials. In order to manufacture the devices, a substrate temperature was set at 850° to 1150° C., a chamber internal pressure was set at 0.3 atmosphere, a total gas flow rate of the raw material gases was set at one liter/min, and the gas flow rates were adjusted to obtain a growth rate of 1 μm/hour. More specifically, the flow rates of source gases were $1 \times 10^{-6}$ mol/min for TEB, $5 \times 10^{-7}$ mol/min for TMA, $5 \times 10^{-7}$ mol/min for TEG, $5 \times 10^{-4}$ mol/min for phosphine, and $1 \times 10^{-3}$ mol/min for ammonia. Silane was used as a n-type dopant, and $Mg(Al(CH_3)_4)_2$ was used as a p-type dopant. The gas flow rates of these dopants were adjusted so as to obtain desired carrier concentrations. Note that a typical layer stacking period is 20 Å and a typical thickness ratio between a nitride layer and a boride layer is 1:1 in the manufacture of a GaAlN/BP superlattice layer. These values were set in the following embodiments unless otherwise specified. Although the present invention can be practiced by other values, if the thickness ratio of GaAlN with respect to BP of a light-emitting layer becomes smaller than 1, a band structure changes from a direct to indirect transition type, thereby reducing a light-emission efficiency. In addition, although the layer stacking period is not limited to the above value, if it exceeds 50 Å, electrons and holes are conspicuously localized to reduce a conductivity. Therefore, it is preferred to set the period or cycle to be 50 Å or less.

A laser device shown in FIG. 6 has an n-type GaP substrate 71, and an n-type GaP buffer layer 72 and an n-type BP buffer layer 73 are formed thereon. A double heterojunction portion constituted by an n-type $Ga_xAl_{1-x}N$/BP multilayered film clad layer 74, an undoped $Ga_xAl_{1-x}N$/BP multilayered film active layer 75, and a p-type $Ga_xAl_{1-x}N$/BP multilayered film clad layer 76 is formed on the buffer layer 73. An n-type BP current blocking layer 77 is formed on the clad layer 76 so as to leave a stripe-like portion on its central portion. A p-type BP contact layer 78 is formed to cover the current blocking layer 77 and the stripe-like exposed surface of the clad layer 76. A metal electrode 79 is formed on the upper surface of the contact layer 78, and a metal electrode 80 is formed on the lower surface of the substrate 71. In this structure, since the current blocking layer 77 is formed around a lower projection of the contact layer 78, current blocking and optical waveguiding can be realized by self-alignment.

Detailed manufacturing steps of the laser device shown in FIG. 6 are as follows. That is, by using the MOCVD apparatus shown in FIG. 1 under the conditions described above, a double hetero structure constituted by an n-type GaP buffer layer 72 (Si-doped, $1 \times 10^{18}$ cm$^{-3}$, 1 μm thick), an n-type BP buffer layer 73 (Si-doped, $1 \times 10^{17}$ cm$^3$, 1 μm thick), an n-type $Ga_{0.4}Al_{0.6}N$/BP multilayered film cad layer 74 (Si-doped, $1 \times 10^{18}$ cm$^{-3}$, 1 μm thick), an undoped $Ga_{0.5}Al_{0.5}N$/BP multilayered film active layer 75 (0.1 μm thick), and a p-type $Ga_{0.4}Al_{0.6}N$/BP multilayered film clad layer 76 (Mg-doped, $1 \times 10^{18}$ cm$^3$, 1 μm thick) was grown on an n-type GaP substrate 71 (Si-doped, $1 \times 10^{18}$ cm$^{-3}$). Subsequently, a 5-μm wide stripe-like SiO$_2$ film mask was formed on the clad layer 76 by thermal decomposition of silane gas and photolithography, an n-type BP current blocking layer 77 (Si-doped, $1 \times 10^{18}$ cm$^{-3}$, 1 μm thick) was selectively grown only on the upper surface of the clad layer 76 by the MOCVD method, and the SiO$_2$ film was removed. A p-type BP contact layer 78 (Mg-doped, $1 \times 10^{18}$ cm$^{-3}$, 1 μm thick) was grown on the current blocking layer 77 and the stripe-like residual clad layer 76. Thereafter, an Au/Zn electrode 79 was formed on the contact layer 78 and an Au/Ge electrode 80 was formed on the lower surface of the substrate 71 by a conventional electrode mounting method, thereby obtaining a laser wafer having the structure shown in FIG. 6.

The obtained wafer was cleaved, and a laser device having a cavity length of 300 μm was fabricated. As a result, green light laser oscillation was obtained at a liquid nitrogen temperature by a pulse operation with a pulse width of 100 μsec. An oscillation threshold current density was about 50 kA/cm$^2$. In addition, the device stably operated over 100 hours.

FIG. 7 shows a modification of the semiconductor device shown in FIG. 6. A clad layer 76 in a double heterojunction portion similar to that shown in FIG. 6 is formed to have a projection to obtain an equivalent lateral refractive index difference, thereby performing transverse mode control. An n-type BP current blocking layer 77 is formed on the clad layer 76 except for at least a portion of the projection. The other portions of the structure are similar to those shown in FIG. 6. In the structure shown in FIG. 7, since the current blocking layer 77 is formed around the projection of the clad layer 76 of a second conductivity type, current blocking and refractive index type optical waveguiding can be realized by self-alignment.

In order to manufacture the device shown in FIG. 7, by using the MOCVD apparatus shown in FIG. 1 under the same conditions as the manufacture conditions of the device shown in FIG. 6, a 5-μm wide stripe-like SiO$_2$ film mask was formed on a clad layer 76 by thermal decomposition of silane gas and photolithography, and the clad layer 76 was etched to form a 3-μm wide stripe-like mesa. Subsequently, an n-type BP current blocking layer 77 (Si-doped, $1 \times 10^{18}$ cm$^{-3}$, 1 μm thick) was selectively grown on only the upper surface of the clad layer 76 by the MOCVD method. Thereafter, the SiO$_2$ film was removed, and a p-type BP contact layer 78 (Mg-doped, $1 \times 10^{18}$ cm$^{-3}$, 1.5 μm thick). Thereafter, electrodes were mounted to complete a laser wafer having the structure shown in FIG. 7.

The obtained wafer was cleaved, and a laser device having a cavity length of 300 μm was fabricated. As a result, green light laser oscillation was obtained at a liquid nitrogen temperature by a pulse operation with a pulse width of 100 μsec. An oscillation threshold current density was about 70 kA/cm$^2$. Although the threshold current density was slightly high, a single-peak far field pattern was confirmed, i.e., good transverse mode control was performed. In addition, the device stably operated over 100 hours.

FIG. 8 is a sectional view showing a light-emitting diode (LED) manufactured by the method of the present invention. Referring to FIG. 8, a p-type GaP buffer layer 92 and a p-type BP buffer layer 93 are sequentially formed on a p-type GaP substrate 91, a p-type GaAlN/BP superlattice layer 94, an undoped GaAlN/BP superlattice layer 95, and an n-type GaAlN/BP super-lattice layer 96 are sequentially stacked thereon, and an n-type GaN contact layer 97 is formed thereon. Ohmic electrodes 98 and 99 are formed on both the surfaces of the wafer. This LED can be similarly manufactured as described above.

In the formation of a Mg-doped p-type III-V Group compound semiconductor layer by MOCVD according to the invention, if a magnesium-containing adduct such as $Mg(Al(CH_3)_4)_2$ or $CH_3Mg(Al(CH_3)_4)$ is used as a Mg-doping source, Al which is a constitutional element of the adduct is incorporated, though very slightly, in a resultant compound semiconductor, though slightly, simultaneously with Mg. Therefore, a care must be taken when a Mg-doped p-type III-V Group compound semiconductor not containing Al is desired to be grown. The present inventors made studies and found that incorporation of Al could be effectively eliminated by performing MOCVD within a certain temperature range. The obtained data will be described below.

Figure 9:
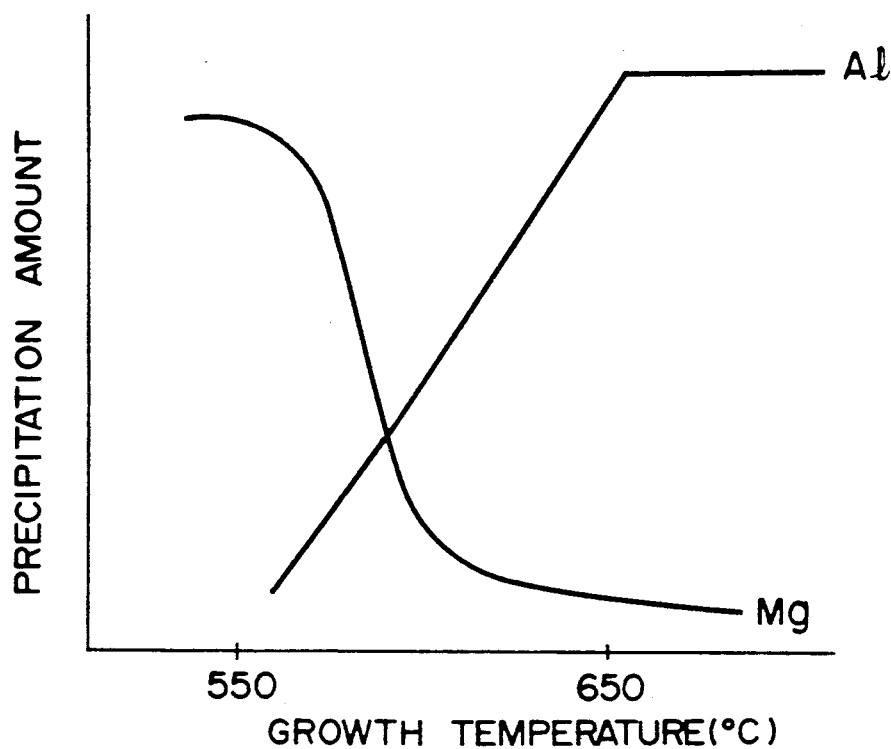
FIG. 9 is a graph showing a substrate temperature dependency of precipitation amounts of Mg and Al from a Mg doping source.

FIG. 9 shows a substrate temperature dependency of a precipitation amount of each of Mg and Al examined to check decomposition rates of the materials, trimethylaluminum and dimethylmagnesium. Since the Mg compound has a low decomposition temperature and is relatively unstable, Mg is precipitated at a comparatively low temperature. However, since the Al compound has a higher decomposition temperature and is more stable, Al begins to be precipitated and saturated from a comparatively high temperature.

Figure 10:
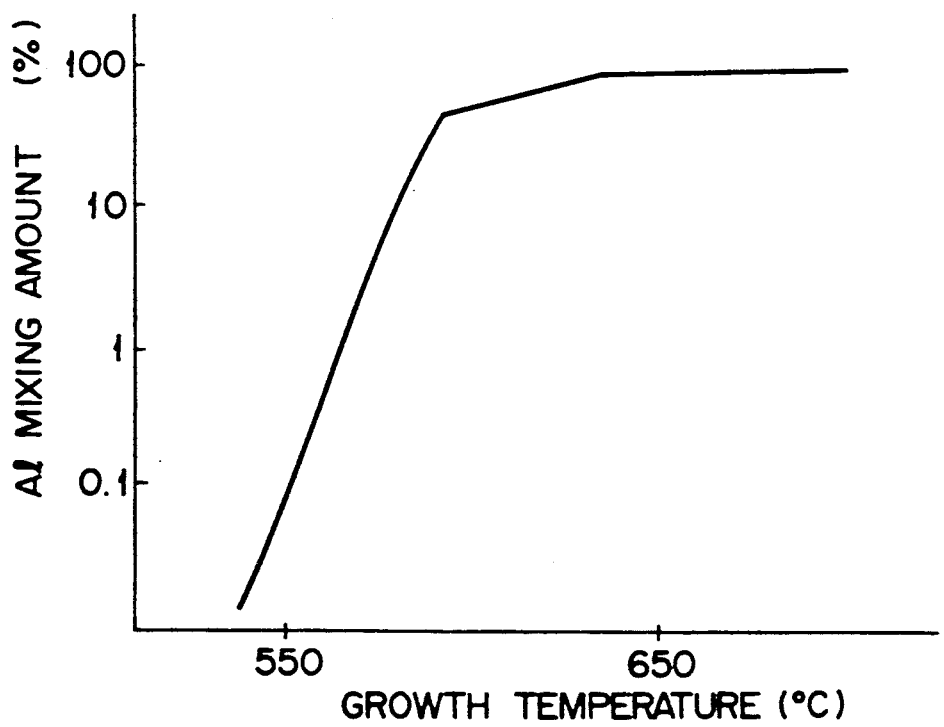
FIG. 10 is a graph showing a growth temperature dependency of an Al mixing amount with respect to a Mg doping amount.

FIG. 10 shows a growth temperature dependency of an Al mixing amount with respect to a Mg doping amount obtained when Mg-doped InP was grown by using $Mg(Al(CH_3)_4)_2$ as a Mg doping source. An Al mixing amount began to decrease at 650° C. or less and abruptly decreased at 570° C. or less. In particular, the mixing amount is 0.1% or less at 550° C. Therefore, this method can be applied to normal optical and electronic devices. That is, when growth is performed at a low temperature of 650° C. or less, decomposition of trimethylaluminum is suppressed, and mixing of Al is reduced to be substantially negligible. This result corresponds to a decomposition temperature of the materials constituting the adduct, and was similarly obtained in growth of GaAs and the like.

In order to suppress mixing of Al in a grown layer, therefore, when a p-type III-V Group compound semiconductor layer is to be formed by MOCVD by using an Mg-containing adduct of the invention containing also Al as described in the above embodiments, a growth temperature is preferably set at 650° C. or less, and more preferably, 550° C. or less. This growth temperature control is effective especially when a Mg-doped III-V Group compound semiconductor layer not containing Al is desired to be formed, using an adduct of the invention also containing Al.

Figure 11:
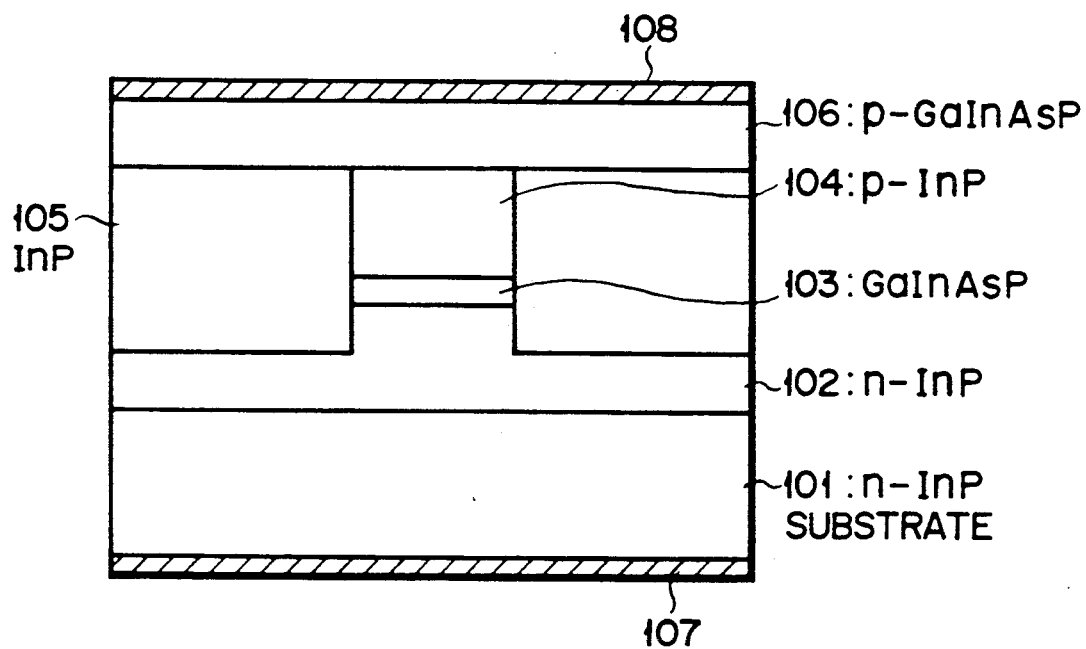
FIG. 11 is a sectional view showing a semiconductor laser manufactured according to still another embodiment of the present invention.

FIG. 11 is a sectional view showing a schematic structure of a semiconductor laser device according to still another embodiment of the present invention.

Referring to FIG. 11, the laser device has an n-type InP substrate 101. An n-type InP clad layer 102 (Si-doped, $1 \times 10^{18}$ cm$^{-3}$, 1 μm thick) also serving as a buffer layer is formed on the InP substrate 101, and a mesa stripe in which an undoped GaInAsP active layer 103 (0.1 μm) and a p-type InP clad layer 104 (Mg-doped, $1 \times 10^{18}$ cm$^{-3}$, 1 μm thick) are stacked is formed on the clad layer 102. A high resistance InP buried layer 105 (1 μm) is buried in both the sides of the mesa, and a p-type GaInAsP contact layer 106 (Mg-doped, $1 \times 10^{18}$ cm$^{-3}$, 0.5 μm thick) is formed on the clad layer 104 which is the uppermost portion of the mesa, and the buried layer 105. Au/AuGe is formed as an n-type side electrode 107 on the lower surface of the substrate 101, and Au/AuZn is formed as a p-type side electrode 108 on the contact layer 106.

All of the above III-V Group compound semiconductor layers of FIG. 11 were epitaxially grown by the MOCVD method. Organic compounds of Group III metals (trimethylgallium and trimethylindium) and Group V element hydrides (phosphine and arsine) were used as materials for III-V Group compound semiconductors. Silane and $Mg(Al(CH_3)_4)_2$ were used as n-type and p-type doing sources, respectively. Growth conditions were a substrate temperature of 620° C., a reaction chamber internal pressure of 200 Torr, a growth rate of 3 μm/hour, and a reaction tube internal flow rate of 70 cm/sec.

The obtained wafer was cleaved, and a semiconductor laser having a cavity length of 250 μm was fabricated. As a result, an oscillation wavelength was about 1.54 μm and single-mode oscillation characteristics were obtained.

Incidentally, the present inventors found that, instead of the above-described magnesium-containing adduct, the following compounds can be similarly effectively used to form Mg-doped p-type III-V Group compound semiconductor layer by the MOCVD method in substantially the same manner as described above:

(A) an organic magnesium compound with two cyclopentadienes having an alkyl group containing 2 or more carbon atoms substituted on each cylopentadiene, i.e., bis(monoalkyl-substituted cyclopentadienyl) magnesium having 2 or more carbon atoms in the alkyl moiety (hereinafter referred to as "compound A");

(B) an organic magnesium compound with two cyclopentadienes having two or more alkyl groups substituted on each cyclopentadiene i.e., bis(di- or more alkyl-substituted cyclopentadienyl) magnesium (hereinafter referred to as "compound B"); or (C) an organometallic compound containing magnesium and oxygen atoms (hereinafter referred to as "compound C").

Examples of compound A include bis(ethylcyclopentadienyl) magnesium, bis(isopropylcyclopentadienyl) magnesium (i-$C_3H_7$)$_2$Cp$_2$Mg), bis(tert-butylcyclopentadienyl) magnesium.

Examples of compound B include bis(dimethylcyclopentadienyl) magnesium (($CH_3$)$_2$Cp)$_2$Mg), bis(diethylcyclopentadienyl) magnesium, bis(dipropylcyclopentadienyl) magnesium, bis(trimethylcyclopentadienyl) magnesium, bis(tetramethylcyclopentadienyl) magnesium, and bis(pentamethylcyclopentadienyl) magnesium.

Compounds A and B have little memory effect described above and can achieve p-type doping in which a concentration change is sharp, though they have a cyclopentadiene.

Examples of compound C include bis(2,2,6,6-tetramethyl-3,5-heptanedionato-O,O') magnesium (Mg(thd)$_2$ or Mg(DPM)$_2$), bis(2,4-pentanedionato-O,O') magnesium (Mg(AcAc)$_2$), and CHC$_5$H$_4$Mg(CO)$_3$. Magnesium-doping sources containing oxygen were not used in the past for fear of contamination by oxygen. In particular, it was thought in the art that an aluminum-containing compound, if it contains oxygen, was not suitable, since it would introduce a large amount of oxygen into semiconductor layers due to its strong Al-O bonds. However, it has been found by the inventors that the oxygen incorporation can be prevented by using an organic magnesium compound containing oxygen of a certain structure. That is, in a certain cyclic compound, compound C, including β-diketone compounds such as Mg(AcAc)$_2$, which is represented by the formula:

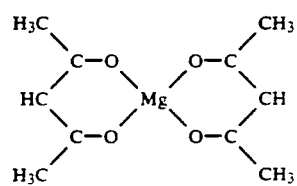

and Mg(thd)₂ which is represented by the formula:

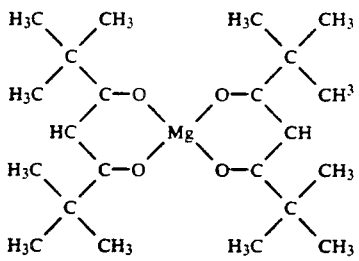

the Mg-O linkages can be broken more easily than the other linkages due to the localization of the electrons, and thus the contamination of semiconductor layers by the oxygen can be prevented. Further, since compound C does not have a cyclopentadiene, no memory effect is involved. Accordingly, by using compound C, p-type doping in which a concentration change is sharp can be achieved by MOCVD.

In fact, Mg(thd)₂, (i-C₂H₅)₂Cp₂Mg or ((CH₃)₂Cp)₂Mg was used as a Mg-doping source, in place of the magnesium-containing adducts, to manufacture the III-V Group compound semiconductor devices of FIGS. 2 to 8 under same conditions described above. The obtained devices exhibited similarly superior performances to those obtained using the magnesium-containing adducts.

As has been described above, according to the present invention, in order to form a magnesium-doped p-type III-V Group compound semiconductor layer by MOCVD method, an adduct of an organic magnesium compound of the invention is used as a magnesium doping source. As a result, sharp magnesium doping can be performed with high controllability. Thus, a III-V Group compound semiconductor device which simultaneously achieves a low threshold value, a high output, and high reliability can be manufactured with high reproducibility.

What is claimed is:

1. In a method of manufacturing a III-V Group compound semiconductor device, including the step of forming a magnesium-doped p-type III-V Group compound semiconductor layer by metal organic chemical vapor deposition, the improvement comprises using an adduct of an organic metal compound containing magnesium with another compound as a doping source of magnesium.

2. The method according to claim 1, wherein said another compound is an organic compound containing a Group III or Group V element, other than magnesium.

3. The method according to claim 1, wherein said adduct is represented by a formula:

$$Mg(E(R)_4)_2$$

where each R represents an alkyl group, and E represents an aluminum or nitrogen atom.

4. The method according to claim 3, wherein each R is an alkyl group having 1 to 4 carbon atoms.

5. The method according to claim 4, wherein each R is a methyl group.

6. The method according to claim 1, wherein said adduct is represented by a formula:

$$RMg(E(R)_4)$$

where each R represents an alkyl group, and E represents an aluminum or nitrogen atom.

7. The method according to claim 6, wherein each R is an alkyl group having 1 to 4 carbon atoms.

8. The method according to claim 1, wherein trimethyl gallium, triethylgallium, trimethylaluminum, triethylaluminum, trimethylboron, triethylboron, diborane, or trimethylindium is used as a source of the Group III element.

9. The method according to claim 1, wherein phosphine, arsine, ammonia, or hydrazine is used as a source of the Group V element.

10. The method according to claim 1, wherein said formation of the p-type compound semiconductor layer is conducted at a reduced pressure of 25 to 300 Torr.

11. The method according to claim 1, wherein said formation of the p-type compound semiconductor layer is conducted at a temperature of 500° to 1150° C.

12. The method according to claim 11, wherein said formation of a p-type compound semiconductor layer is conducted at a temperature of not more than 650° C.

13. A method of forming a magnesium-doped p-type III-V Group compound semiconductor layer by metal organic chemical vapor deposition, comprising reacting, in a vapor phase, at least one compound of a Group III element with at least one compound of a Group V element, in the presence of an adduct of an organic magnesium compound with another compound as a doping source of magnesium.

14. The method according to claim 13, wherein said another compound is an organic compound containing a Group III or Group V element, other than magnesium.

15. The method according to claim 13, wherein said adduct is represented by a formula:

$$Mg(E(R)_4)_2$$

where each R represents an alkyl group, and E represents an aluminum or nitrogen atom.

16. The method according to claim 15, wherein each R is an alkyl group having 1 to 4 carbon atoms.

17. The method according to claim 16, wherein each R is a methyl group.

18. The method according to claim 13, wherein said adduct is represented by a formula:

$$RMg(E(R)_4)$$

where each R represents an alkyl group, and E represents an aluminum or nitrogen atom.

19. The method according to claim 18, wherein each R is an alkyl group having 1 to 4 carbon atoms.

20. The method according to claim 13, wherein trimethyl gallium, triethylgallium, trimethylaluminum, triethylaluminum, trimethylboron, triethylboron, diborane, or trimethylindium is used as said compound of the Group III element.

21. The method according to claim 13, wherein phosphine, arsine, ammonia, or hydrazine is used as said compound of the Group V element.

22. The method according to claim 13, wherein said reaction layer is conducted at a reduced pressure of 25 to 300 Torr.

23. The method according to claim 13, wherein said reaction is conducted at a temperature of 500° to 1150° C.

24. The method according to claim 23, wherein said reaction is conducted at a temperature of not more than 650° C.

* * * * *